United States Patent [19]

Hirano et al.

[11] Patent Number: 5,723,347
[45] Date of Patent: Mar. 3, 1998

[54] SEMI-CONDUCTOR CHIP TEST PROBE AND PROCESS FOR MANUFACTURING THE PROBE

[75] Inventors: Toshiki Hirano, Tokyo-to; Atsuo Kimura, Ohtsu; Shinichiro Mori, Kusatsu, all of Japan

[73] Assignee: International Business Machines Corp., Armonk, N.Y.

[21] Appl. No.: 736,543

[22] Filed: Oct. 24, 1996

Related U.S. Application Data

[62] Division of Ser. No. 321,503, Oct. 12, 1994, Pat. No. 5,625,298.

[30] Foreign Application Priority Data

Sep. 30, 1993 [JP] Japan .................................. 5-244385

[51] Int. Cl.⁶ .......................... H01L 21/66; H01L 21/68; G01R 1/02; G01R 1/067
[52] U.S. Cl. .................. 437/8; 437/228; 29/25.01; 371/755; 371/762; 371/765; 371/149
[58] Field of Search .......................... 437/8, 927, 228 M, 437/228 PE, 228 H; 29/25.01; 371/755, 762, 765, 149

[56] References Cited

U.S. PATENT DOCUMENTS

| | | | |
|---|---|---|---|
| 5,012,087 | 4/1991 | Littlebury | 324/158 P |
| 5,264,787 | 11/1993 | Woith et al. | 324/158 P |
| 5,386,110 | 1/1995 | Toda | 250/216 |
| 5,489,812 | 2/1996 | Furuhata et al. | 310/309 |

*Primary Examiner*—David Graybill
*Attorney, Agent, or Firm*—Thornton & Thornton; William D. Sabo; Mark F. Chadurjian

[57] ABSTRACT

This discloses a probe structure which does not rely on cantilevered wire and which has controlled contact pressure between the probe contacts and the I/O pads on a semiconductor chip and which comprises a plurality of conductive contact electrodes, electrically coupled to respective leads, formed, on a film stretched across a respective plurality of cavities established in a substrate. The cavities and the contact electrodes are aligned to one another and both positionally match selected I/O pads existing on a semiconductor chip to be probed.

Also disclosed is a probe utilizing a cantilevered, metalized oxide tongue extending across a cavity.

8 Claims, 9 Drawing Sheets

SEMI-CONDUCTOR CHIP TEST PROBE AND PROCESS FOR MANUFACTURING THE PROBE

This is a divisional of application(s) Ser. No. 08/321,503 filed on Oct. 12, 1994 U.S. Pat. No. 5,625,298.

FIELD OF THE INVENTION

The invention generally relates to probes used for contacting semi-conductor chip pads to temporarily provide the chips with electrical inputs such as from an external tester and more particularly to a probe suitable for full wafer burn-in or acceleration testing.

BACKGROUND OF THE INVENTION

In semi-conductor manufacturing, after a plurality of chips are formed on a wafer, each of the chips are probed in sequence to initially check certain of their electrical characteristics. Following this initial probing the wafer is diced. Subsequent to the dicing operation the chips are packaged and subjected to a burn-in or acceleration test to remove those products subject to initial failure. This acceleration test simulates long-time operation by operating a circuit at a temperature of about 150° C. while selected signal patterns and sequences are applied thereto.

One type of probe, used in the prior art, is comprised of a plurality of fixed needles mounted on respective cantilevered tungsten wires supported on an epoxy substrate. The wires are connected to an external tester and the needles are brought into to contact with respective ones of the chip input/output (I/O) pads. The needles thus serve as contact electrodes. This needle and cantilevered wire arrangement, although used for many years in the semi-conductor industry, is not suitable for high density products. Also it has been found that when the chip, under test, is heated during burn-in test the needles tend to shift, from their original positions, due to thermal expansion differences between the needles, the cantilevered wires and the chip. This thermal shifting is especially exaggerated when the chips are being tested in wafer, i.e., un-diced form and can cause false reading or inputs.

Recently multi-chip module technology (MCM), in which there are a plurality of chips mounted on a single package substrate, has been on the rise. The package used in this MCM technology is very expensive and may be lost if any chip thereon fails during acceleration testing. Therefore, if costs are to be reduced, means must be found that will enable the chips to be subjected to burn-in tests before they are packaged. One Solution is to subject the chips to acceleration testing while they are still in wafer form and prior to their dicing and packaging.

One attempt to meet the new requirements of the MCM technology, formed probe contact electrodes on the surface of a glass board by a lithographic technique with each contact being electrically connected to an external tester via a respective conductive via passing through a hole on the board. This was disclosed by T. Tada et al., in "A Fine Pitch Probe Technology" 1990 International Test Conference, pp. 900–906. Probes, so formed, were found to be unacceptable for they failed to compensate for differences in height between the I/O pads on the chip or wafer being tested. In such a case, some pads were not contacted by the contact electrodes because the glass, lacked sufficient flexibility. Moreover, the process to manufacture was found to be complicated and costly.

In an attempt to over come the flexibility problem, B. Leslie, et al., described, in an article entitled "Membrane Probe Card Technology for VLSI Wafer Testing" which was given at the 1988 International Test Conference, pp. 601–607, a new probe in which both the contact electrodes and interconnecting wiring were formed on a flexible film. It was believed that by applying pressure from a side opposite to the contact electrodes improved contact between a pad and a probe would be achieved. A similar device was disclosed in an article by M. Beiley, et al.; entitled "Array Probe Card," Multi-Chip Module Conference, pp. 28–31, 1992 and in U.S. Pat. No. 5,103,557 by G. J. Leedy, et al.

However, the probes, described in these articles, were found to also have contact electrode pressure problems. It was found that uniform contact electrode pressure on the pads could not be made due to the excessive flexibility of the entire film.

Thus, there exists a need for a probe which overcomes the contact electrode problems encountered by the prior art and which can be made inexpensively by an easily implemented process. Furthermore the probe is suitable for full wafer probing by providing a multiplicity of probes on a single substrate wherein each individual probe is provided for each respective chip location on the wafer.

SUMMARY OF THE INVENTION

The present invention discloses a probe structure, suitable for individually and selectively testing semi-conductor chips. The probe can also be adapted to test the chip while in situ on a wafer. The probe of the present invention, (hereafter called a microprobe) can be readily formed on a substrate using presently available and semi-conductor processes well known to the art.

The substrate, on which the probe structure, of the present invention, is formed, is provided with a plurality of cavities which positionally match the I/O pads on the semi-conductor chip to be tested. These cavities are covered with a thin film, on which the contact electrodes are located. These contact electrodes are formed on the film right above these cavities and connected to conductive leads connected to an external tester and the film in conjunction with the underlying cavity provides a uniform contact pressure between the contact electrodes and the pads on the chip being tested even though there are pad height differences or high temperature conditions.

DESCRIPTION OF THE INVENTION

Turning now to the figures and particularly FIGS. 1 to 2 an embodiment of the present invention will be described in detail.

Figure 1:
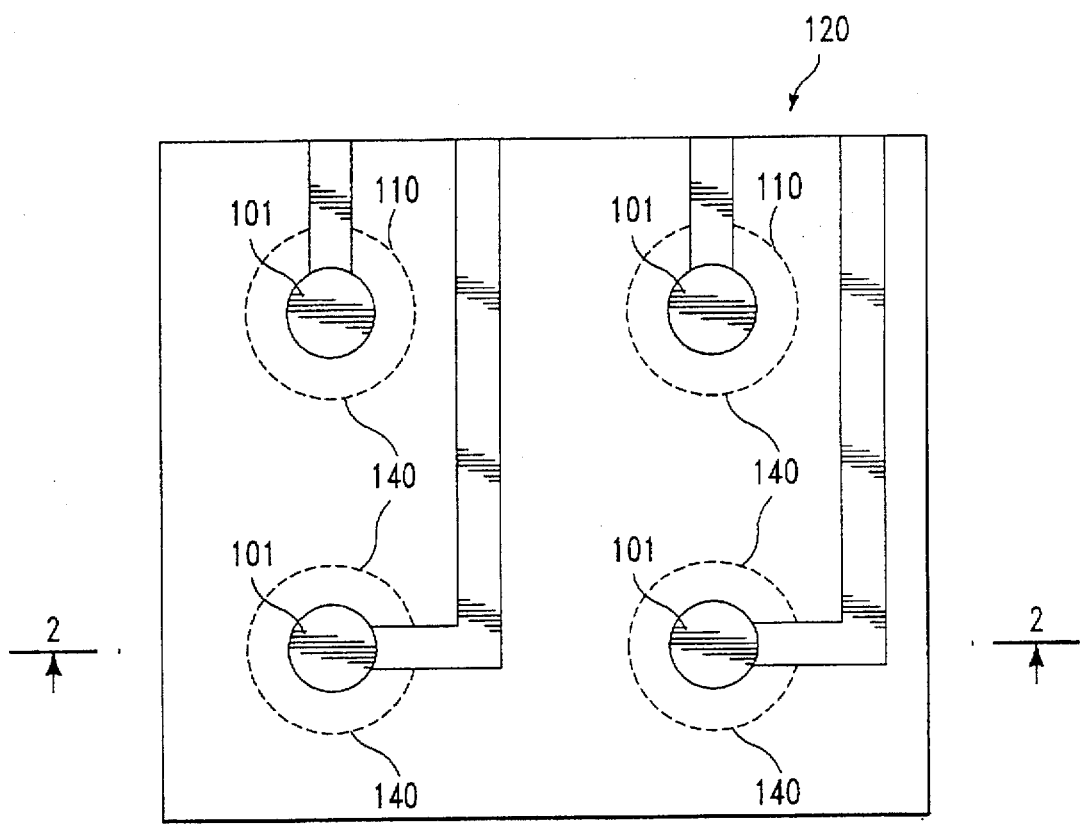
FIG. 1 is a top view of a microprobe according to the present invention.
Figure 2:
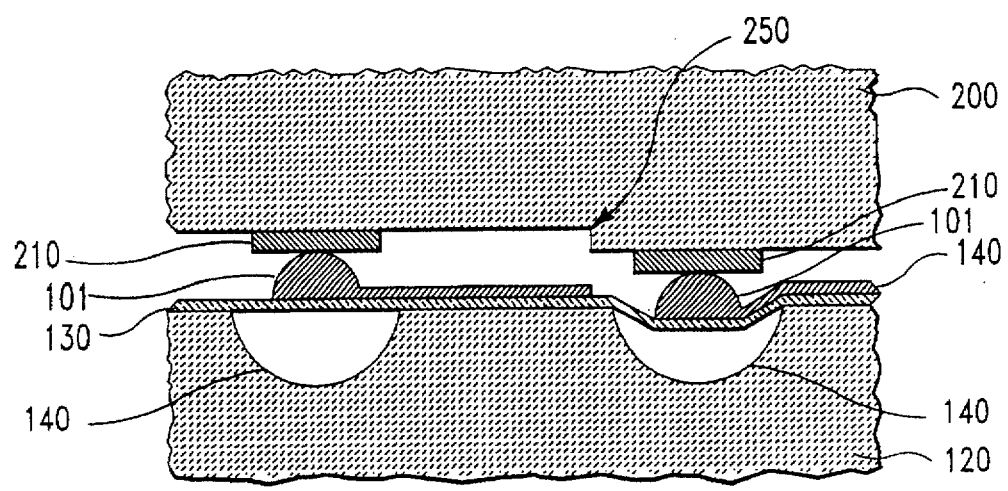
FIG. 2 is a sectional view of the microprobe of FIG. 1 taken along the lines 2—2 and in contact with a chip to be tested.

FIG. 1 is a top view of a simplified microprobe built in accordance with the present invention and FIG. 2, is a cross sectional view of the microprobe of FIG. 1, taken along the lines 2—2 with the contact electrodes of the microprobe shown in contact with the pads of a semi-conductor chip which is to be tested.

The microprobe shown here is comprised of a semi-conductor substrate 120 having four cavities 140 formed therein and overcoated with a thin, flexible, insulating film 130, such as polyimide, which not only covers the surface of the substrate 120 but bridges the cavities 140.

Four contact electrodes 101 are disposed on the upper surface of the film 130 and each electrode 101 is located over a respective cavity 140. Each of these contact electrodes 101 has the proximal end of a respective conductive lead 110 connected thereto. These leads 110 are also disposed on the surface of the film 130 and lead to one edge of the substrate where the distal end of each is appropriately connected to an external tester (not shown) in a manner well known to the prior art.

Preferably the contact electrodes 101 and the leads 110 are formed of low resistance metals, such as gold, copper, or their alloys. The substrate material used for the probe should be formed of material identical to the substrate of the device being tested in order to ensure that the thermal expansion characteristics of the probe and the wafer, being tested, match. The use of matching substrate materials prevents positional dislocation caused by thermal expansion differences between the probe and the wafer being tested especially during burn-in or acceleration testing.

Commonly semi-conductor wafers are formed of silicon thus the probe substrate would also be formed of silicon. However it should be understood that the probe substrate could be made of any material that has a coefficient of expansion substantially the same as the semi-conductor chip to be probed.

As shown in FIG. 2, the chip 200 to be tested has a plurality of I/O (Input/Output) pads 210 thereon. These pads 210 are connected to suitable circuits (not shown) created in the wafer 200 by techniques and in a manner well known to the semi-conductor art. Thus each electrode 101 on the surface of the microprobe is designed and positioned to contact a selected respective I/O pad on the wafer 200. It should be noted that some tests do not require that each and every pad 210 on the semi-conductor device be contacted by a probe contact electrode.

The cavity 140, positioned below each electrode 101, acts in conjunction with the flexible film 130 to provides some vertical, i.e. a spring, movement to each electrode to compensate for height differences in the pads 210 disposed on the surface of the wafer 200 being tested. For example, if the surface of the wafer 200 has a step difference 250, as shown in FIG. 2, this difference can be compensated for by the elasticity of the layer 130 flexing into the respective underlying cavity 140, thereby allowing all the electrodes 101 and their opposing I/O pads 210 to come into contact with each other at a uniform contact pressure. In this way, the probe of the invention can tolerate differences in pad height on a chip while applying a uniform contcat pressure between the pads and the contact electrodes.

It should be noted that although only a single, simplified contact electrode arrangement for a single chip is shown in FIGS. 1 and 2 that the principles discussed herein can be expanded to more complex and denser contact electrode arrangements for mating with denser more complex chip I/O pads. The invention can also be expanded to provide a multiplicity of contact electrodes a single substrate such as may be needed to simultaneously contact all the chips on a wafer.

One method of forming the contact electrodes of the microprobe of the invention shown in FIGS. 1 and 2 is given briefly below. As shown in FIG. 1 and 2, a polyimide layer 130, several micrometers in thickness, is formed on a first or upper surface of the silicon substrate 120. This film 130 is formed by applying a high viscosity, liquid material, i.e., polyimide, on the surface and spinning the substrate to form a substantially uniform film as is well known to the art. Once the polyimide is spread over the surface it is dried and hardened by heating and a small hole is opened in the layer 130 by well known photolithography and etching techniques. The position of each hole formed in the layer 130 would, of course, generally match the position of a respective and corresponding I/O pad to be contacted by a contact electrode. This can be readily accomplished by using the pattern or footprint used to produce the chip or wafer I/O pads as the pattern for the photolithography step needed to create the holes.

The silicon substrate 120 is now exposed to a plasma etching process. The plasma passes through the hole in the film and is selected to etch the underlying silicon selectively and isotopically, such that the diameters of the cavities 140 are significantly greater than the diameter of the hole and thus extend under the layer 130. That is; a portion of the layer 130 is cantilevered over the cavity 140.

The metal leads 110 are then formed on the polyimide layer 130 by first depositing a layer of the selected metal over the surface of the polyimide layer 130 using well known metal evaporation or deposition techniques and coating the deposited metal layer with a layer of a photoresist. This photoresist layer is now patterned, using well known photographic exposure and development processes to establish the configuration or pattern of each of the leads 110. Once the lead pattern is so established the leads 110 are defined in the metal layer by using a suitable etch to define the leads 110. It is of course necessary, for the reason set forth below, for one end, i.e., the proximal end, of each lead 110 to terminate on the polyimide generally over the center of a respective cavity and the other distal end at or near the edge of the substrate.

Following the formation of the leads 110 the remainder of the photoresist may be removed and a new layer of photoresist deposited and again exposed and developed to create a small opening therein which is aligned with and extends over the proximal end of each lead 110.

A generally hemispherical metal electrode in the form of a projection or bump is now formed, in the opening formed in this second photoresist layer, by electroplating a highly conductive, easily formed metal such as gold, copper, or the like therein. Following this electrode plating operation the second photoresist layer may be removed.

Turning now to FIGS. 3 to 8 another method of making a microprobe in accordance with the present invention will be described. In this and following descriptions the elements common to the embodiment discussed above, in conjunction with FIGS. 1 and 2, will be explained using under the identical reference numbers for identical materials or steps.

Figure 3:
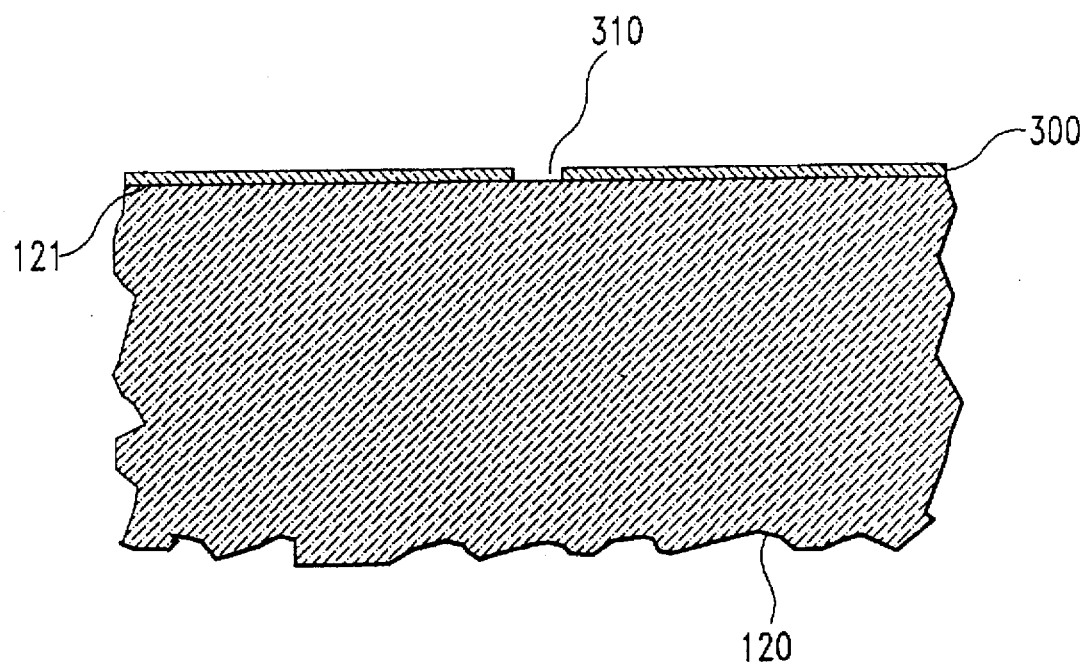
FIG. 3 illustrates one step in the forming of a microprobe according to the invention.

As shown in FIG. 3, a silicon oxide layer 300, several thousands Angstroms in thickness, is formed, e.g., grown or deposited on a first or upper surface 121 of the silicon substrate 120 and a small hole 310 is opened in the layer 300 by well known photolithography and etching techniques. The position of each hole 310 formed in the layer 300 would, of course, match the position of a respective and corresponding I/O pad it is to contact. This can be readily accomplished by using the pattern or footprint used to produce the chip or wafer I/O pads as the pattern for the photolithography step needed to create the holes.

Figure 4:
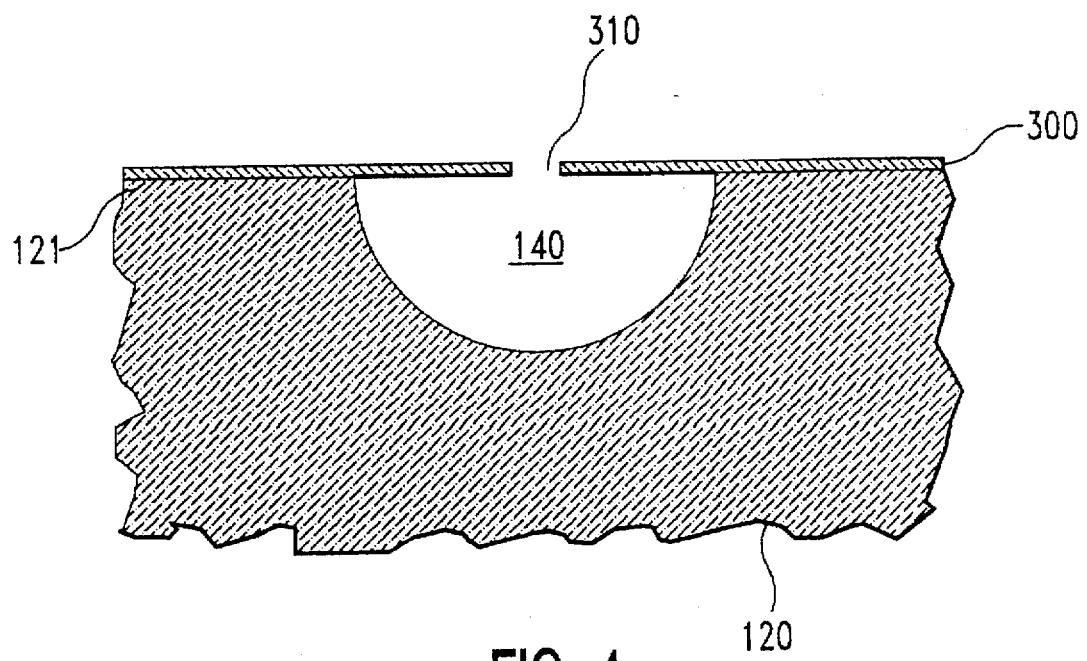
FIG. 4 illustrates a different step in the forming of a microprobe according to the invention.

The silicon substrate 120 is now exposed to a plasma etching process. The plasma passes through the hole 310 and is selected to etch the underlying silicon selectively and isotopically, such that the diameters of the cavities 140 are significantly greater than the diameter of the hole 130 and thus extend under the layer 300. That is; a portion of the layer 300 is cantilevered over the cavity 140 as shown in FIG. 4.

Figure 5:
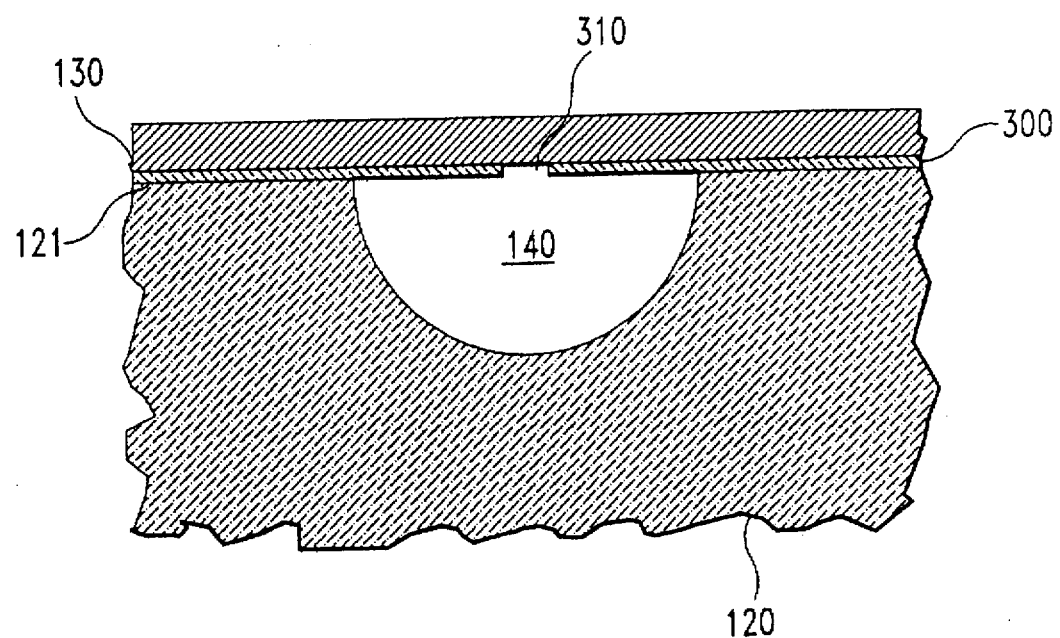
FIG. 5 illustrates another step in the forming of a microprobe according to the invention.
Figure 6:
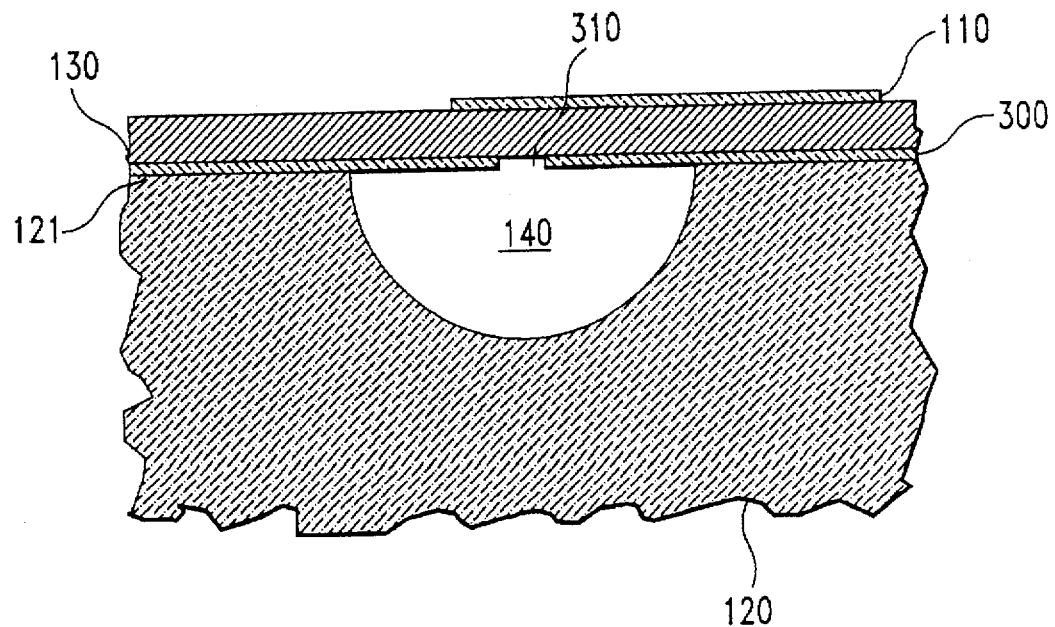
FIG. 6 illustrates still another step in the forming of a microprobe according to the invention.

Next, a flexible film 130, several micrometers in thickness, is formed over the oxide layer 300 as shown in FIG. 5. This film 130 is formed by applying a high viscosity, liquid material, i.e., polyimide, on the surface and spinning the substrate to form a substantially uniform film as is well known to the art. Because the polyimide has a high viscosity and the hole 310 is small it is prevented from entering the cavity through the hole 310 and instead bridges the hole or opening 310.

The metal lead 110 is then formed on the oxide layer 130 as shown in FIG. 6, again using well known metal evaporation or deposition techniques.

Figure 7:
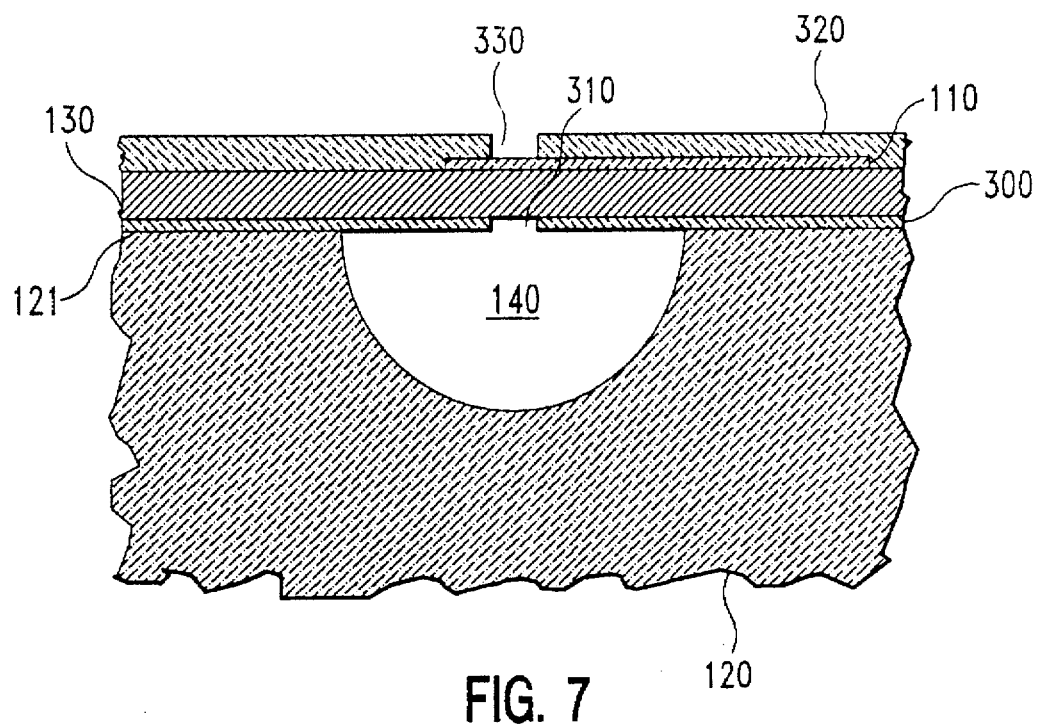
FIG. 7 illustrates a further step in the forming of a microprobe according to the invention.

Following the formation of the lead 110, as shown in FIG. 7, a photoresist layer 320 is coated over the entire surface of the device and over the lead 110. This photoresist is now patterned to form a an opening 330 therein above and in line with the hole 310 formed in the layer 300, to expose a portion of the lead 110.

Figure 8:
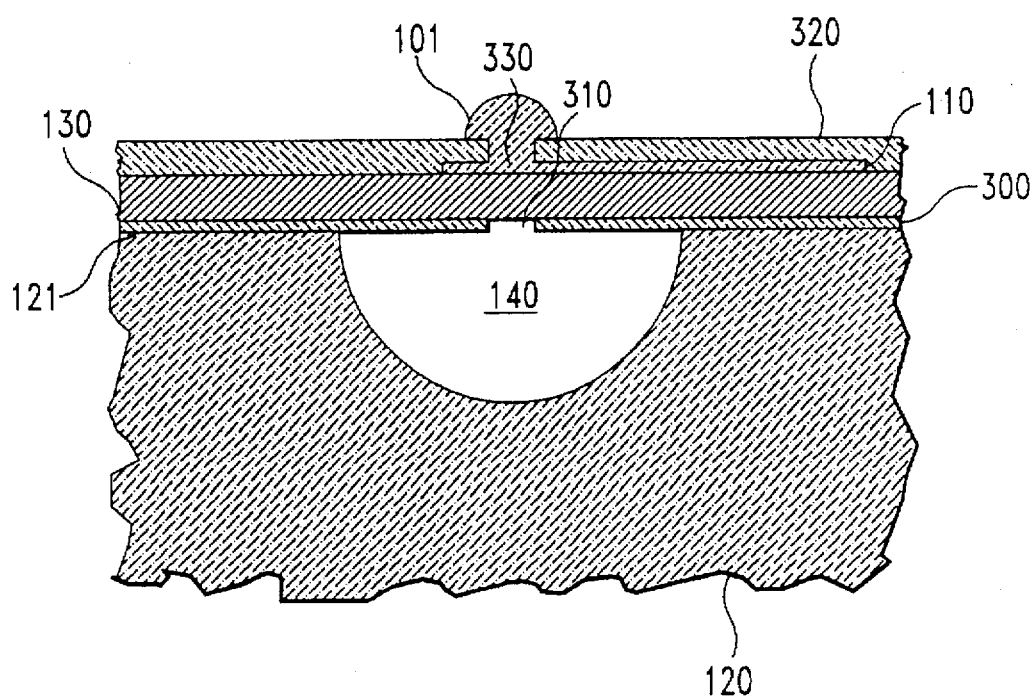
FIG. 8 illustrates still a further step in the forming of a microprobe according to the invention.

As shown in FIG. 8, a metal electrode 101 in the form of a projection or bump is formed by electroplating a highly conductive, easily formed metal such as gold, copper, or the like in the hole 330. Following this electrode plating operation the photoresist layer 30 may be removed.

Figure 9:
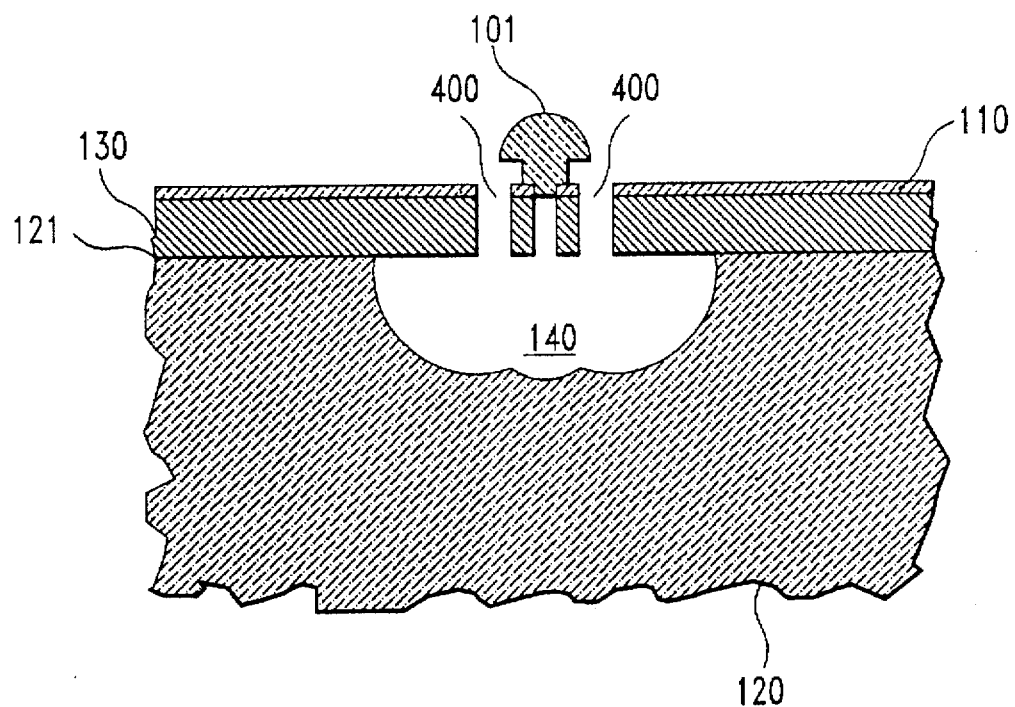
FIG. 9 shows a different embodiment of a microprobe according to the invention.
Figure 10A:
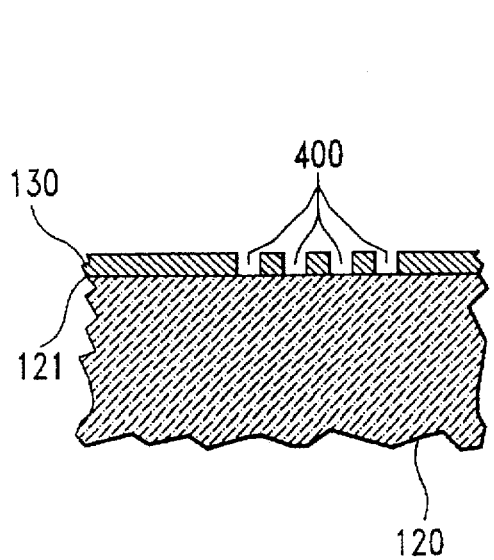
FIG. 10 illustrates one step of forming the microprobe of FIG. 9.
Figure 10B:
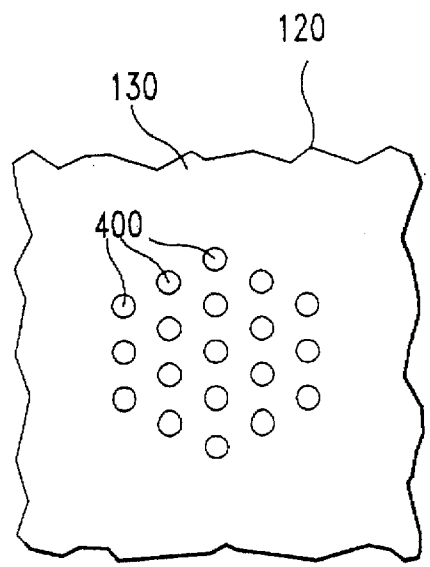
Figure 11A:
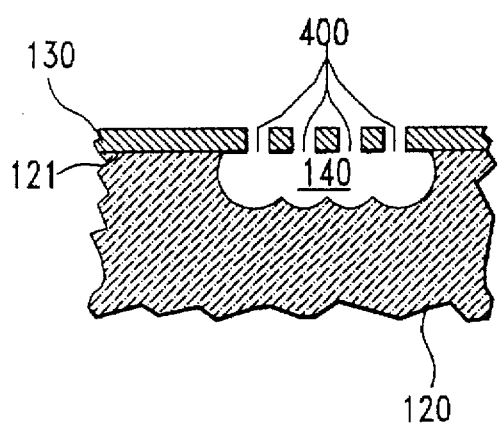
FIG. 11 illustrates another step of forming the microprobe of FIG. 9.
Figure 11B:
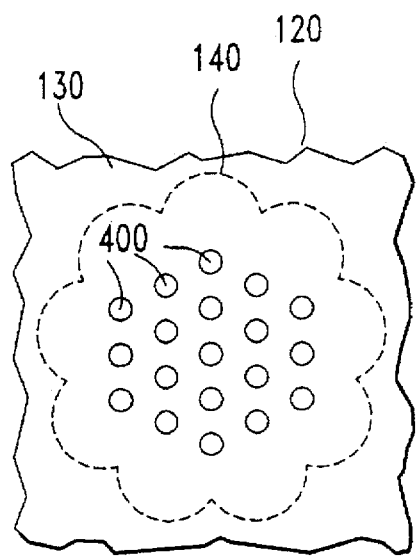
Figure 12A:
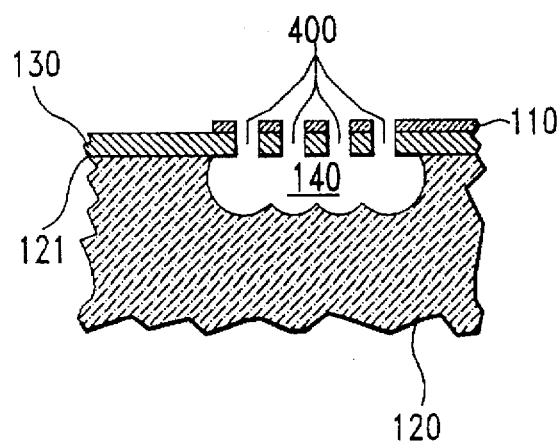
FIG. 12 illustrates one step of forming a microprobe according to the invention.
Figure 12B:
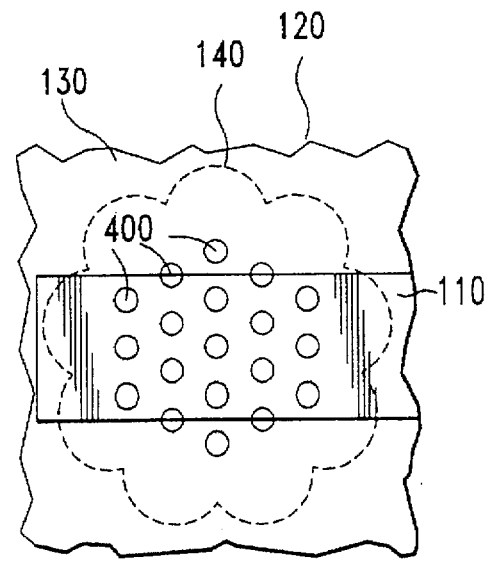

Turning now to FIG. 9 shows a still another embodiment of the invention will be described.

This embodiment does not use the oxide underlayer 300 discussed in FIGS. 3 to 8 but instead places the polyimide coating 130 directly on the upper surface of the substrate 120 similar to that discussed in conjunction with FIGS. 1 and 2.

FIGS. 10 to 14 show the manufacturing process to produce the device shown in FIG. 9. In these figures, both sectional views (FIGS. 10a–14a) and the top views (FIGS. 10b–14b) corresponding to them are shown.

As shown in FIGS. 10a, 10b, 11a, and 11b an organic film 130 is uniformly applied on the silicon substrate 120, and then hardened by baking. Once the film is hardened a plurality of small holes 400, about 5 μm in diameter, are formed in a defined area 420 using the photoresist process described above to expose portions of the top surface of the silicon substrate 120. Now the chip or wafer substrate 120 is etched selectively and isotopically by a suitable plasma as above described. This etching results in a cavity 140 being formed below these holes.

Figure 13A:
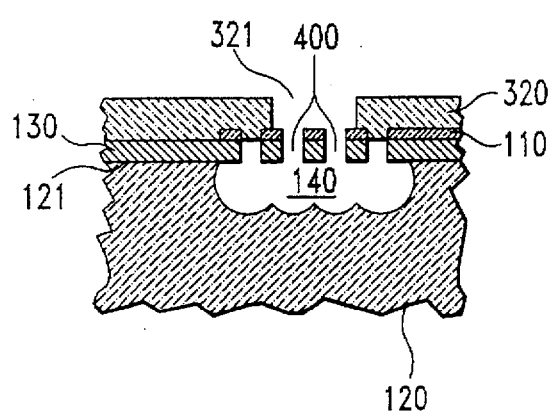
FIG. 13 illustrates one step of forming a microprobe according to the invention.
Figure 13B:
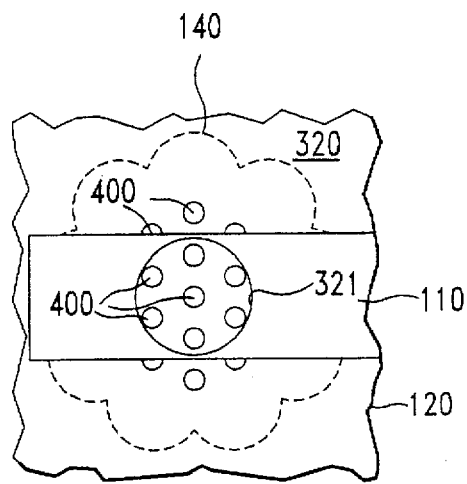
Figure 14A:
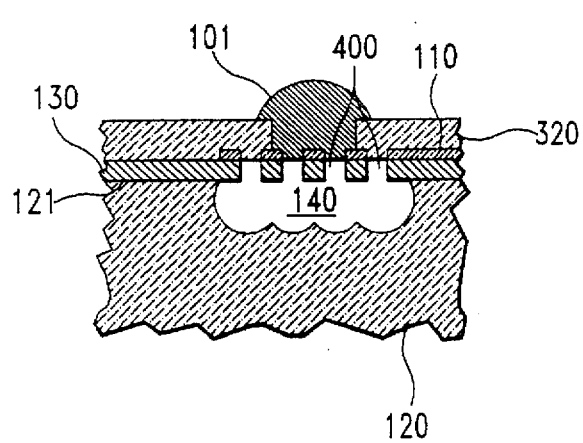
FIG. 14 illustrates one step of forming a microprobe according to the invention.
Figure 14B:
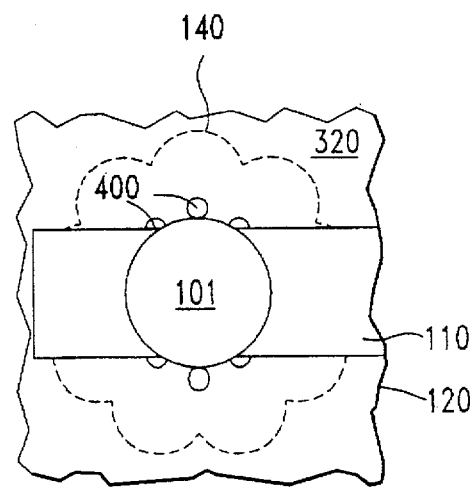

Once the holes are formed, as shown in FIG. 12a, and again as described above, a metal lead 110 is formed and defined atop the organic film 130. Next, as shown in FIGS. 13a and 13b, a photoresist layer 320 is applied and a central opening 321 is made in the film 320 so that the contact electrode 101 can be formed on top of the and in electrical contact with the proximal end of lead 110 as shown in FIGS. 14a and 14b. Following the formation of the contact electrode 101 the photoresist layer 320 is usually removed.

This process generally results in a higher yield than can be expected using the steps in conjunction with either FIGS. 1 and 2 or with FIGS. 3 to 8 as set out above.

Figure 15:
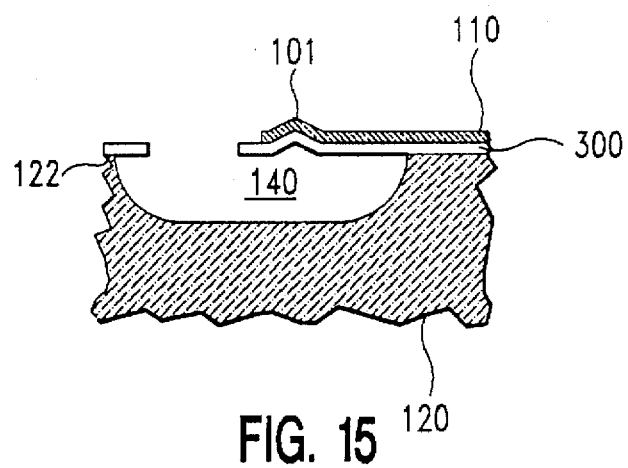
FIG. 15 shows an embodiment of a microprobe according to the invention.

FIG. 15 shows still another embodiment according to the invention in which the lead 110 and the contact electrode 111 are unitary, being defined from the same metal layer in a single step, and are disposed on a cantilevered oxide beam extending over the cavity 140. As will be discussed below the process used results in the unitary contact electrode 111 being pointed.

The manufacturing process required to produce this configuration is shown in FIGS. 16a and 16b through 20a and 20b. As in the case above, the views labeled 16a, 17, 18, 19a, and 20a are sectional views and the views labeled 16b, 19b, and 20b are top views.

Figure 16A:
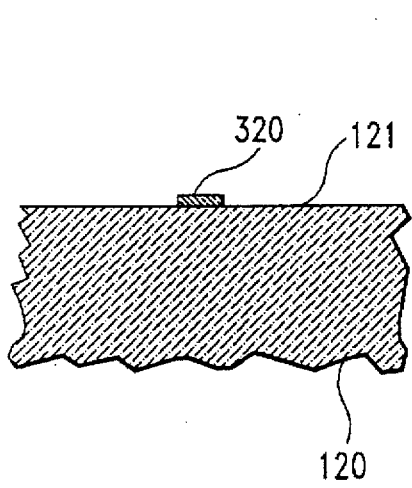
FIG. 16 illustrates one step of forming a microprobe according to the invention.
Figure 16B:
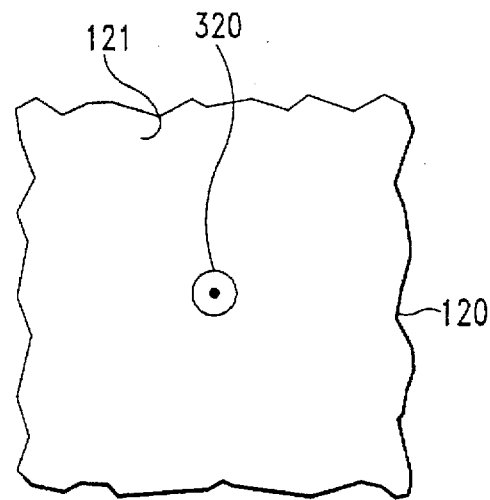
Figure 17:
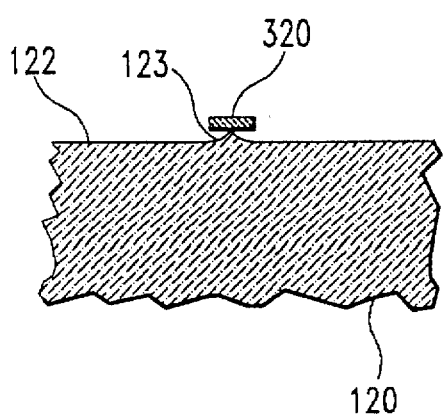
FIG. 17 illustrates one step of forming a microprobe according to the invention.

As shown in FIGS. 16a and 16b, a photoresist layer is placed directly on the surface of the substrate 100 and defined to leave a small circular dot of photoresist 320 at a predetermined position on the silicon substrate 120, which position corresponds to a pad on the device to be tested. Next, the substrate is subjected to a suitable etchant to etch the surface 121 of the substrate isotopically. Because the etch is isotropic it also etches the surface 121 of the substrate beneath the edges of the photoresist dot 320. This isotropic etch forms a new lower surface 122. however by controlling the time of the etch the amount of penetration of the etch beneath the dot 320 may be controlled to leave under the dot 320 a mesa or pinnacle 123 as shown in FIG. 17.

Figure 18:
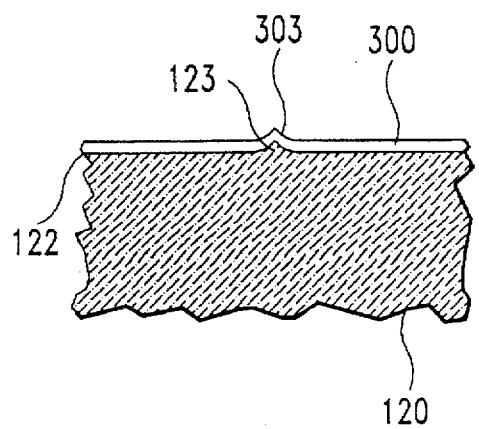
FIG. 18 illustrates one step of forming a microprobe according to the invention.
Figure 19A:
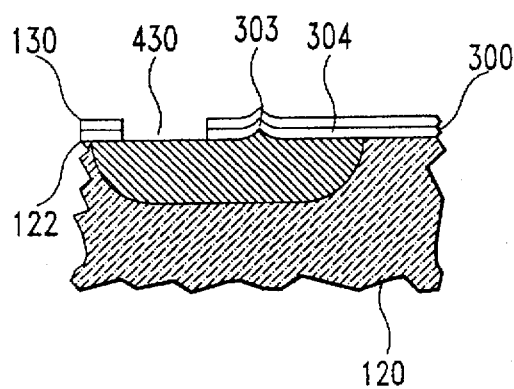
FIG. 19 illustrates one step of forming a microprobe according to the invention.
Figure 19B:
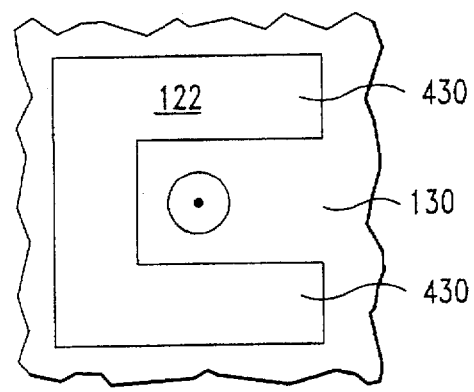
Figure 20A:
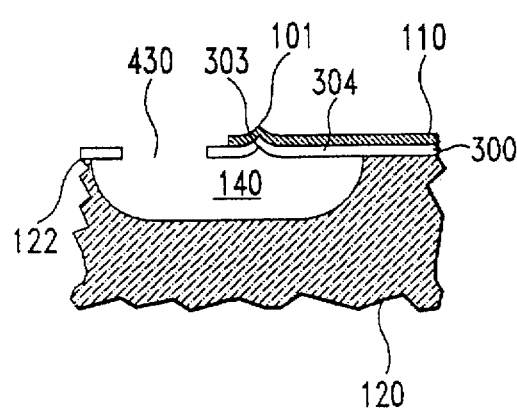
FIG. 20 illustrates one step of forming a microprobe according to the invention.
Figure 20B:
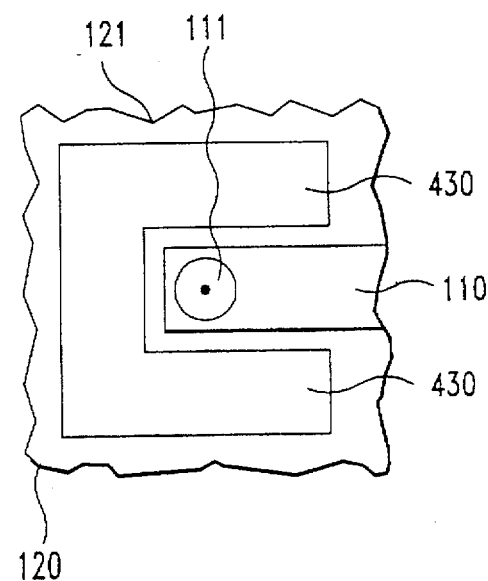

Once the etching process is terminated the photoresist dot 320 is removed and the entire new surface 122 of the substrate is oxidized to form the oxide film 300 thereon as shown in FIG. 18. It is to be noted because the oxide forms uniformly over the surface of the substrate the point or pinnacle 123 is replicated in the oxide layer 300 as point 303 as shown in FIG. 18. Once this oxide layer 300 has been formed it is overcoated with a photoresist layer 130 which is exposed and developed to create a C shaped section 430 which surrounds the point or pinnacle established in the oxide layer. This C shaped section is now transferred to the surface 122 of the substrate 100 by, etching through the photoresist, the underlying exposed oxide layer 300 as shown in FIGS. 19a and 19b. The entire device is now subjected to an etchant that will selectively and isotopically etch the substrate surface through the opened oxide layer such that a cantilevered tongue of oxide 304 remains extending out over the cavity 140 formed in the substrate 120.

Once this oxide tongue 304 is formed the metal lead 110 is defined and formed thereon. As shown in FIG. 20 the metal lead 110 extends the length of the tongue 304 to overlie the point or pinnacle 303 to form a pointed contact electrode 111 thereon. The cantilevered, metal coated, oxide tongue 304 acts as a spring and applies a contact pressure to any opposing I/O pad.

This pointed contact results in improved and more stable electrical contact between the contact electrode and the semi-conductor chip pad.

This completes the description of the invention. Since changes may be made in the above described devices or processes without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims.

What is claimed is:

1. A probe structure for testing semi-conductor chips, comprising:

a substrate;

an oxide film for covering over said substrate and at least a part of some cavities, said cavities being formed in said substrate;

an organic film formed on and extending over said oxide film;

a plurality of conductive projections, formed on said organic film;

each of said projections being aligned, with a respective one of said cavities, and positionally matched with a respective I/O pad on a semi-conductor chip to be probed; and conductive leads connected with said projections.

2. The probe structure as set forth in claim 1, wherein said oxide film has at least one small hole therein over each of said cavities.

3. A probe structure for testing semi-conductor chips, comprising:

a substrate having first and second substantially parallel surfaces;

an oxide film covering said first surface of said substrate;

a plurality of cavities formed on said substrate beneath said film;

a plurality of conductive projections, on said oxide film, each being positioned above a respective one of said cavities and positionally aligned with a respective pad on a semi-conductor chip; and conductive leads connected to said projections.

4. The probe structure as set forth in claim 1, wherein said projections are connected with leads which are constituted of conductive material.

5. A method of forming a microprobe comprising the steps of:

selecting a substrate having first and second surfaces;

forming a substantially uniform elastic layer, on said first surface of the substrate;

opening a small hole in said elastic layer;

exposing said substrate, coated with said elastic layer, to a plasma etching process selected to etch the underlying substrate selectively and isotopically, to form a cavity under each such opening with a diameter significantly greater than the diameter of the opening in said elastic layer;

forming a plurality of metal leads on the elastic layer; and forming a metal electrode in contact with said leads over the opening formed in the elastic layer.

6. The method of claim 5 wherein said leads and contact electrodes are formed of a metal selected from the group comprising gold or copper.

7. A method of forming a microprobe comprising the steps of:

selecting a substrate having first and second surfaces;

forming a substantially uniform polyimide layer, several micrometers in thickness, on said first surface of the substrate by applying a high viscosity, liquid polyimide on the surface and spinning the substrate;

baking said polyimide to harden said layer;

opening a small hole in said hardened layer;

exposing said substrate, coated with said hardened polyimide, to a plasma etching process selected to etch the underlying substrate selectively and isotopically, to form a cavity under each such opening with a diameter significantly greater than the diameter of the opening in said polyimide layer;

forming a plurality of metal leads on the polyimide layer by;

depositing a layer of the selected metal over the surface of the polyimide layer;

coating the deposited metal layer with a layer of a photoresist;

patterning said photoresist layer to establish the configuration or pattern of each of said leads;

defining said leads in said metal layer by etching said metal layer wherein one end of each respective lead terminates on the polyimide layer adjacent a respective hole formed therein;

removing the remainder of the photoresist;

forming a second layer of photoresist over said leads and said polyimide layer;

exposing and developing said second photoresist layer to create a plurality of openings therein each off which is coaxial with a respective opening in said polyimide layer and extending over the end of the respective lead adjacent the respective opening in the polyimide layer;

forming a generally hemispherical metal electrode in the opening formed in this second photoresist layer, by electroplating a highly conductive, easily formed metal therein; and removing the second photoresist layer.

8. A method of forming a microprobe comprising the steps of:

selecting a substrate having first and second surfaces;

forming substantially circular polyimide dots, several micrometers in thickness, at predetermined positions on said first surface of the substrate;

exposing said first surface of said substrate, coated with said dots thereon, to a plasma etching process selected to etch the underlying substrate selectively and isotopically, to form a pinnacles under each such dot, each pinnacle having a diameter less than the dot of said photoresist;

removing the photoresist dot;

replicating said pinnacles in an oxide layer by oxidizing the surface of the substrate to from an oxide layer thereon;

overcoating said oxide layer with a photoresist layer;

exposing and developing said photoresist layer to expose a C shaped section of the surface of said oxide layer around each pinnacle on said surface;

etching the exposed portion of said oxide layer to expose a C shaped section of said substrate surface;

selectively and isotopically etching said exposed substrate surface to form a cavity therein which extends under a cantilevered tongue of oxide carrying replicated pinnacle; and forming metal leads on each said tongue; said metal lead on each tongue extending the length of the tongue and overlying said pinnacle.

* * * * *